United States Patent
Bieling et al.

(10) Patent No.: US 11,169,445 B2
(45) Date of Patent: Nov. 9, 2021

(54) PUPIL FACET MIRROR, OPTICAL SYSTEM AND ILLUMINATION OPTICS FOR A PROJECTION LITHOGRAPHY SYSTEM

(71) Applicant: Carl Zeiss SMT GmbH, Oberkochen (DE)

(72) Inventors: Stig Bieling, Aalen (DE); Martin Endres, Koenigsbronn (DE); Thomas Fischer, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 15/930,406

(22) Filed: May 12, 2020

(65) Prior Publication Data
US 2020/0272058 A1    Aug. 27, 2020

Related U.S. Application Data

(63) Continuation of application No. PCT/EP2018/080492, filed on Nov. 7, 2018.

(30) Foreign Application Priority Data

Nov. 17, 2017 (DE) .......................... 102017220586.5

(51) Int. Cl.
*G03F 7/20* (2006.01)

(52) U.S. Cl.
CPC .................................. *G03F 7/702* (2013.01)

(58) Field of Classification Search
CPC . G03F 7/20; G03F 1/36; G03F 7/2037; G03F 7/70; G03F 7/70058;
(Continued)

(56) References Cited

U.S. PATENT DOCUMENTS 9,983,484 B2    5/2018    Endres et al.
10,018,917 B2   7/2018    Biding et al.
(Continued)

FOREIGN PATENT DOCUMENTS

DE           101 00 265 A1    7/2002
DE     10 2009 032 194 A1    4/2010
(Continued)

OTHER PUBLICATIONS

International search report, with translation thereof, for corresponding PCT Appl No. PCT/EP2018/080492, dated Apr. 12, 2019.
(Continued)

*Primary Examiner* — Mesfin T Asfaw
(74) *Attorney, Agent, or Firm* — Fish & Richardson P.C.

(57) ABSTRACT

An optical system includes an illumination optical unit configured to guide illumination radiation along a path to an object plane. The illumination optical unit includes comprising a first facet mirror; a second facet mirror disposed (Continued)

downstream of the first facet mirror along the path; and a condenser mirror. The optical system also includes a projection optical unit configured to image a first article in the object plane onto a second article in an image plane. The image plane is a first distance from the object plane. The condenser mirror a second distance from the object plane. The second distance is greater than the first distance

21 Claims, 8 Drawing Sheets

(58) Field of Classification Search
CPC .. G03F 7/70091; G03F 7/70141; G03F 7/702; G03F 7/704; G03F 7/70458; G03F 7/70116; G03F 7/70075; G03F 7/7015; G03F 7/70316; G03F 7/70033; G03F 7/70883; G03F 7/70083; G03F 7/7085; G03F 7/70233; G03F 7/70191; G03F 7/70575; G03F 7/70158; G03F 7/70266; G03F 7/70183; G03F 7/70133; G03F 7/70566; G03F 7/70175; G02B 27/0983; G02B 17/0615; G02B 17/0663; G02B 5/09; G02B 5/0891; G21K 1/06
See application file for complete search history.

(56) References Cited

U.S. PATENT DOCUMENTS

| | | | |
|---|---|---|---|
| 2002/0131181 A1 | 9/2002 | Singer et al. | |
| 2004/0140440 A1* | 7/2004 | Schultz | G21K 1/06 250/504 R |
| 2013/0063716 A1* | 3/2013 | Mann | G02B 19/0047 356/51 |
| 2015/0355555 A1* | 12/2015 | Maul | G03F 7/70075 355/71 |
| 2016/0327868 A1* | 11/2016 | Endres | G03F 7/70075 |

FOREIGN PATENT DOCUMENTS

| | | |
|---|---|---|
| DE | 10 2014 216 802 A1 | 2/2016 |
| DE | 10 2014 223 453 A1 | 5/2016 |
| WO | WO 2009/100856 A1 | 8/2009 |

OTHER PUBLICATIONS

German Examination Report, with translation thereof, for corresponding DE Appl No. 10 2017 220 586.5, dated Jun. 28, 2018.

* cited by examiner

PUPIL FACET MIRROR, OPTICAL SYSTEM AND ILLUMINATION OPTICS FOR A PROJECTION LITHOGRAPHY SYSTEM

CROSS-REFERENCE TO RELATED APPLICATIONS

The present application is a continuation of, and claims benefit under 35 USC 120 to, international application PCT/EP2018/080492, filed Nov. 7, 2018, which claims benefit under 35 USC 119 of German Application No. 10 2017 220 586.5, filed Nov. 17, 2017. The entire disclosure of these applications are incorporated by reference herein.

FIELD

The disclosure relates to a pupil facet mirror for an illumination optical unit of a projection exposure apparatus. Moreover, the disclosure relates to an optical system for a projection exposure apparatus. The disclosure furthermore relates to an illumination optical unit of a projection exposure apparatus. Furthermore, the disclosure relates to a projection exposure apparatus. Finally, the disclosure relates to a method for producing a microstructured or nanostructured component and to a component produced according to the method.

BACKGROUND

The basic structure of a projection exposure apparatus, in particular of an illumination optical unit with a honeycomb condenser, is known. For details, reference should be made, in exemplary fashion, to WO 2009/100 856 A1.

SUMMARY

According to a first aspect of the disclosure, a pupil facet mirror for an illumination optical unit of a projection exposure apparatus includes a plurality of pupil facets, wherein the totality of the pupil facets has a smallest elliptical edge curve enveloping the pupil facets, the elliptical edge curve having an axis ratio a/b ranging from 1.1 to 1.68, in particular ranging from 1.24 to 1.52, where a denotes the semi-major axis and b denotes the semi-minor axis. Here, a smallest enveloping elliptical edge curve denotes the closed elliptical curve that surrounds the totality of the pupil facets and, in so doing, has the smallest possible area.

According to a further aspect of the disclosure, a pupil facet mirror for an illumination optical unit of a projection exposure apparatus includes a plurality of pupil facets, wherein at least a subset of the pupil facets has different refractive powers in the tangential and sagittal directions. Here, tangential and sagittal denote two orthogonal normal sections of the pupil facet surface, which, as usual, are oriented in relation to the alignment of the object, i.e., the field facet to be imaged. Consequently, the pupil facets have an aspherical embodiment in particular, optionally a toric embodiment.

The relative difference $\delta R_{rel}$ between the two principal radii of curvature in the sagittal and tangential section $$\delta R_{rel} = \frac{|R_{tan} - R_{sag}|}{\frac{1}{2}(R_{tan} + R_{sag})}$$

is at least 20%; however, it could even be more than 100% or even 500%. In fact, the pupil facets can also be cylindrical, in the sense that one of the two principal radii of curvature becomes infinite at the facet center. It is likewise possible for the pupil facets to form a saddle surface, i.e., one principal radius of curvature is positive while the other is negative.

According to the disclosure, it was recognized that this can reduce the field dependence of the illumination of the exit pupil of the projection exposure apparatus. Specifically, this supports an astigmatic entrance pupil, i.e., the existence of a tangential entrance pupil and a sagittal entrance pupil whose relative positions do not coincide, and the imaging conditions of the field facets on the reticle at the same time. Should attention only be paid to the imaging of the field facets in the case of different relative positions of the two entrance pupils, it is possible to design the pupil facets and the transmission optical unit in spherical fashion and accept the field dependence of the exit pupil on the wafer.

A pupil facet mirror according to the disclosure is advantageous, in particular, in the case of a projection exposure apparatus with a projection optical unit imaging in anamorphic fashion.

A further aspect of the disclosure relates to an optical system for a projection exposure apparatus, wherein a footprint on the second facet mirror has an envelope with a first aspect ratio $AV_1$ and the projection optical unit has an entrance pupil with a second aspect ratio $AV_2$, where: $AV_1 \neq AV_2$.

Here, the footprint denotes the intersection of the surface of the second facet mirror, in particular the plane in which the second facet mirror is disposed, with a light tube defined by the numerical aperture on the wafer, i.e., in the image field. The field size is also included in the definition of the light tube. Especially in the case of a relative position of the pupil facet mirror that differs from a pupil surface (orientation, curvature), a totality of footprints assigned to individual field points will arise on the pupil facet mirror. This is also a reason why the footprint is not exactly an ellipse, see below.

The envelope of the footprint can be the smallest convex envelope, in particular the smallest elliptical envelope.

By way of an appropriate embodiment, in particular of the second facet mirror, it is possible to take account of the fact that a further mirror that influences this aspect ratio is disposed between the second facet mirror and the reticle. Expressed differently, by appropriately adapting the footprint on the second facet mirror, it is possible to adapt same on the entrance pupil of the projection optical unit.

In particular, the second facet mirror can be embodied in the form of a pupil facet mirror in accordance with the preceding description. Here, the totality of pupil facets can have a smallest, enveloping, elliptical edge curve with an axis ratio a/b ranging from 1.1 to 1.68. However, this is not mandatory. An embodiment of the second facet mirror deviating therefrom is likewise possible.

In particular, the relative difference between the two aspect ratios $AV_1$ and $AV_2$ is at least 10%:

$$\frac{|AV_1 - AV_2|}{\frac{1}{2}(AV_1 + AV_2)} \geq 10\%$$

According to a further aspect of the disclosure, an optical system for a projection exposure apparatus includes an illumination optical unit including at least two facet mirrors, wherein the footprint on the second facet mirror has a non-elliptical shape.

In local coordinates, e.g., polar coordinates, the form of the footprint on the second facet mirror can be represented as follows:

$$\overrightarrow{r_{real}}(\varphi) = t(\varphi)\vec{r}(\varphi) = (1+\alpha(\varphi))\vec{r}(\varphi)$$

where $$\vec{r}(\varphi) = (a\cos(\varphi), b\cos(\varphi)+b_0)$$

represents a parameterization of an ellipse fitted to the planar footprint, for example a least-square fit, and $t(\varphi)$ denotes stretching with a direction-dependent stretching factor $1+\alpha(\varphi)$, where the following, for example, applies to $\alpha(\varphi)$:

$$\alpha(\varphi) = -A\sin(3\varphi)$$

with $0.005 < A < 0.02$.

The radial deviation of the footprint from a best-fit ellipse ranges, in particular, from 0.5% to 2%.

In particular, the optical system in accordance with the preceding description can include a pupil facet mirror and/or an illumination optical unit in accordance with the preceding description.

According to a further aspect of the disclosure, the projection optical unit of the projection exposure apparatus images in anamorphic fashion. In particular, it has imaging scales in the scanning direction and perpendicular thereto, which differ in terms of absolute value by at least 10%, in particular at least 50%, in particular at least 100%, in particular at least 200%, in particular at least 400%. The imaging scales can have the same sign. They can also have different signs.

According to a further aspect of the disclosure, the projection optical unit has a mechanically inaccessible entrance pupil.

According to a further aspect of the disclosure, an illumination optical unit for guiding illumination radiation from a radiation source to an object plane includes at least two facet mirrors disposed in succession in the beam path, wherein the second facet mirror is tilted relative to the first facet mirror in such a way that an average folding angle ranges from 20° to 35°.

It was found that this leads to a good compromise between imaging the intermediate focus via the switchable facets of the first facet mirror onto the facets of the second facet mirror that is as focused as possible and illuminating the exit pupil of the projection optical unit, in particular an arrangement of the second facet mirror in a plane that represents the best-possible approximation to a surface conjugate to the entrance pupil of the projection optical unit, that is as field-independent as possible. In general, the surface conjugate to the entrance pupil is not a plane but a surface with a curvature that differs from zero. For simplicity, a pupil plane is nevertheless referred to below.

According to a further aspect of the disclosure, the second facet mirror is disposed so as to be tilted relative to a surface that is conjugate to an entrance pupil plane of the projection optical unit to the best-possible extent or relative to a plane fitted thereto.

According to a further aspect of the disclosure, an illumination optical unit for guiding illumination radiation from a radiation source to an object plane includes a transmission optical unit disposed downstream of the second facet mirror in the beam path, wherein the transmission optical unit has different refractive powers in the tangential and sagittal directions. In particular, the transmission optical unit forms a condenser system for imaging the second facet mirror into the entrance pupil of the projection optical unit.

Such an embodiment of the transmission optical unit facilitates convergent illumination of the reticle. At the same time, it facilitates the compensation of astigmatism generated by a folding angle at the condenser mirror. The transmission optical unit has imaging aberrations; the astigmatism is dominant in this case. This astigmatism is compensated by way of the introduction of toric surfaces. Moreover, the transmission optical unit can serve to assist the astigmatic imaging of the entrance pupil into the exit pupil of the projection optical unit, i.e., design this imaging to be field-independent in particular.

According to a further aspect of the disclosure, the relative refractive power difference expressed by the different radii of curvature in tangential and sagittal direction $$\delta R_{rel} = \frac{|R_{tan} - R_{sag}|}{\frac{1}{2}(R_{tan} + R_{sag})}$$

ranges from 5% to 30%, more particularly ranges from 7% to 22%. These values were found to be particularly advantageous in the case of the distance between the second facet mirror and the condenser mirror ranging from 1.5 m to 2.5 m.

According to a further aspect of the disclosure, the transmission optical unit includes one, two or more mirrors. In particular, it can include one or two normal incidence mirrors (NI mirrors) and/or one or two grazing incidence mirrors (GI mirrors).

A further aspect of the disclosure relates to a projection exposure apparatus having a pupil facet mirror in accordance with the preceding description and/or an illumination optical unit in accordance with the preceding description and/or an optical system in accordance with the preceding description.

Further objects of the disclosure consist in improving a method for producing a microstructured or nanostructured component and also a corresponding component. These objects are achieved by the provision of a projection exposure apparatus in accordance with the description above. The advantages are evident from those of the projection exposure apparatus.

BRIEF DESCRIPTION OF THE DRAWINGS

Further details and advantages of the disclosure will become evident from the following description of exemplary embodiments with reference to the figures, in which.

DESCRIPTION OF EXEMPLARY EMBODIMENTS

Constituent parts of a microlithographic projection exposure apparatus 1 are first described below in exemplary fashion with reference to FIG. 1. The description of the basic design of the projection exposure apparatus 1 and of the constituent parts thereof should not be construed as restrictive in this case. The prior art has disclosed numerous developments and alternatives of the general principle.

An illumination system 2 of the projection exposure apparatus 1 has, besides a radiation source 3, an illumination optical unit 4 for illuminating an object field 5 in an object plane 6. Here, a reticle 20 disposed in the object field 5 is exposed. The reticle 20 is held by a reticle holder 21.

The reticle 20 is displaceable, particularly in a scanning direction.

Figure 1:
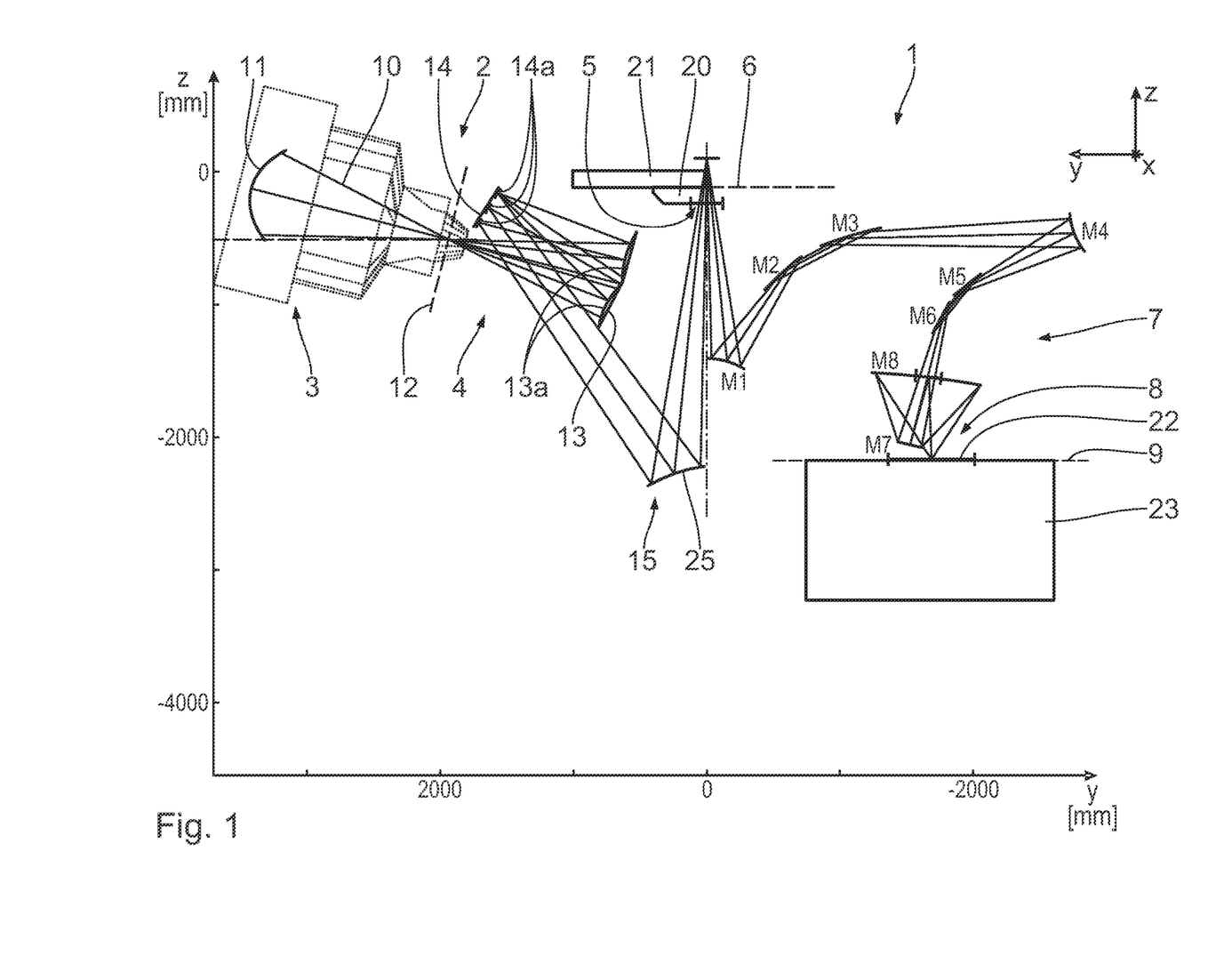
FIG. 1 schematically shows a meridional section of the beam path of a projection exposure apparatus.

A local Cartesian xyz-coordinate system is plotted in FIG. 1 to aid the explanation. The reticle 20 serves as a reference point for the coordinate system plotted in FIG. 1. Here, the scanning direction of the reticle 20 corresponds to the y-direction. The z-direction runs perpendicular to the object plane 6.

Moreover, the projection exposure apparatus 1 includes a projection optical unit 7. The projection optical unit 7 serves for imaging the object field 5 into an image field 8 in an image plane 9. A structure on the reticle 20 is imaged onto a light-sensitive layer of a wafer 22 disposed in the region of the image field 8 in the image plane 9. The wafer 22 is held by a wafer holder 23. In particular, it is displaceable via the wafer holder 23. It can be displaceable in a manner synchronized with the reticle 20.

The radiation source 3 is an EUV radiation source. In particular, the radiation source 3 emits EUV radiation 10, which is also referred to as used radiation or illumination radiation below. In particular, the used radiation has a wavelength ranging from 5 nm to 30 nm. The radiation source 3 can be a plasma source. This can also be a synchrotronbased radiation source.

The illumination radiation 10 which emerges from the radiation source 3 is focused by a collector 11.

The illumination radiation 10 propagates through an intermediate focus plane 12 downstream of the collector 11. The intermediate focus plane 12 can represent a separation between the radiation source module and the illumination optical unit.

The illumination optical unit 4 includes a first facet mirror 13. Provided the first facet mirror 13 is disposed in a plane of the illumination optical unit 4 that is optically conjugate to the object plane 6, the facet mirror is also referred to as a field facet mirror 13. The first facet mirror 13 includes a multiplicity of individual first facets 13a, which are also referred to as field facets below.

By way of example, as known from DE 10 2008 009 600 A1, the first facets 13a themselves can each be composed of a multiplicity of individual mirrors, in particular a multiplicity of micromirrors. In particular, the first facet mirror 13 can be embodied as a microelectromechanical system (MEMS system). For details, reference is made to DE 10 2008 009 600 A1.

A second facet mirror 14 is disposed downstream of the first facet mirror 13 in the beam path of the illumination optical unit 4. Provided the second facet mirror 14 is disposed in a pupil plane of the illumination optical unit 4, the facet mirror is also referred to as pupil facet mirror. The second facet mirror 14 can also be arranged at a distance from a pupil plane of the illumination optical unit 4. In this case, the combination of the first facet mirror 13 and the second facet mirror 14 is also referred to as a specular reflector.

The second facet mirror 14a includes a plurality of second facets 14a. In the case of a pupil facet mirror, the second facets 14a are also referred to as pupil facets.

Figure 2:
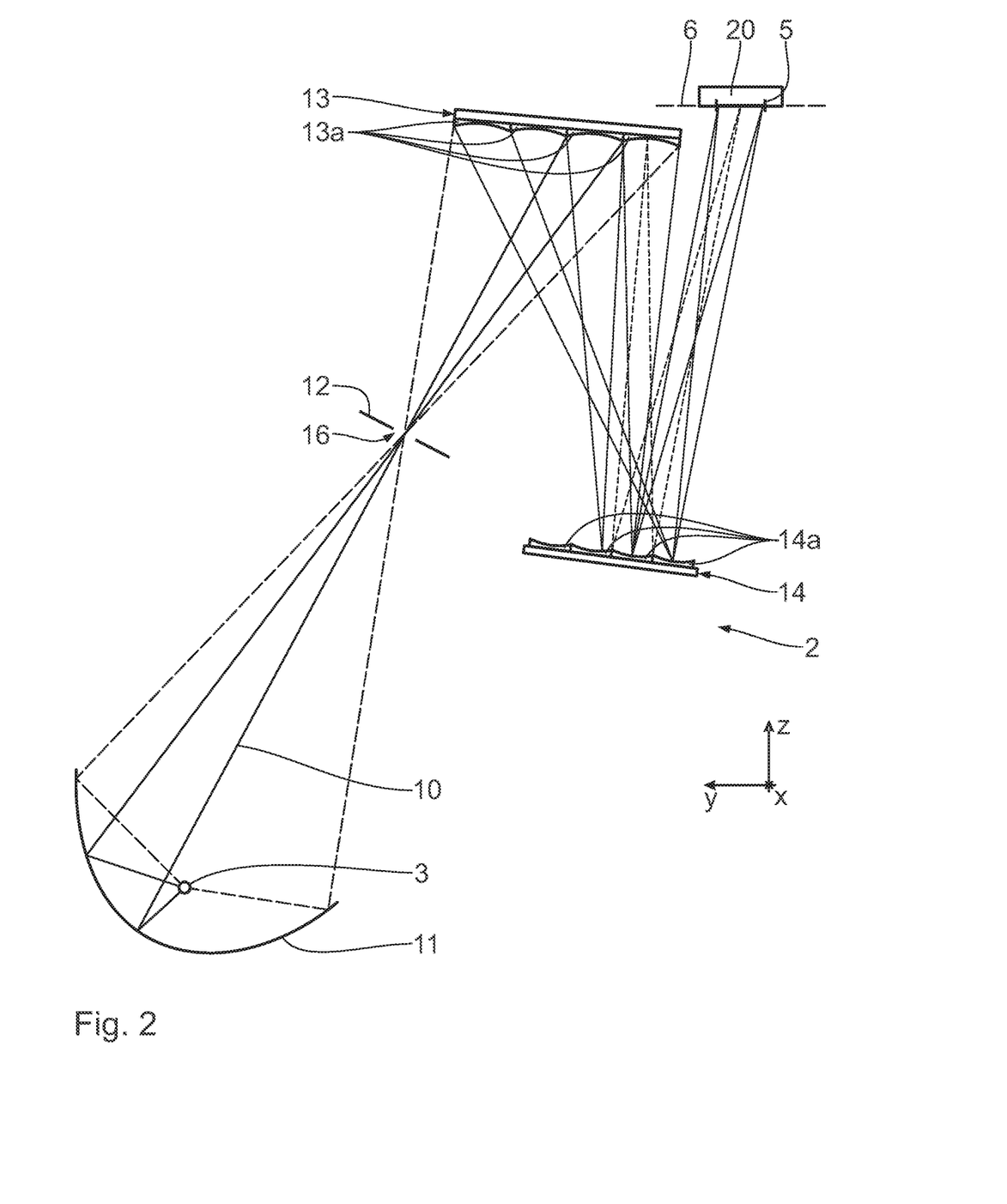
FIG. 2 schematically shows a section of the beam path of a projection exposure apparatus from the region of the illumination optical unit.

Details of the faceting of the first facet mirror 13 and of the second facet mirror 14 are once again elucidated in FIG. 2 in exemplary fashion.

Consequently, the illumination optical unit 4 forms a double-faceted system. This basic principle is also referred to as a fly's eye integrator.

As will still be explained in more detail below, it may be advantageous to dispose the second facet mirror 14 not exactly in a plane that is optically conjugate to a pupil plane of the projection optical unit 7.

The individual first facets 13a are imaged into the object field 5 with the aid of the second facet mirror 14 and an imaging optical assembly in the form of a transmission optical unit 15.

However, it was recognized that the imaging of the first facets 13a into the object plane 6 via the second facets 14a or by the second facets 14a and a transmission optical unit 15 is only approximate. This will still be explained in more detail below.

The transmission optical unit 15 is illustrated schematically as an individual mirror in FIG. 1. FIG. 2 illustrates an alternative without a transmission optical unit 15. In general, the transmission optical unit 15 includes one, two or more mirrors, which are disposed in succession in the beam path of the illumination optical unit 4. In particular, it can include one or two normal incidence mirrors (NI mirrors) and/or one or two grazing incidence mirrors (GI mirrors).

Here, an NI mirror refers to a mirror that is disposed in the beam path of the illumination optical unit in such a way that illumination radiation incident thereon has an angle of incidence of no more than 30° relative to a mirror normal.

Here, a GI mirror refers to a mirror that is disposed in the beam path of the illumination optical unit in such a way that illumination radiation incident thereon has an angle of incidence of at least 70° relative to a mirror normal.

The projection optical unit 7 includes a plurality of mirrors $M_i$, which are numbered in accordance with their arrangement in the beam path of the projection exposure apparatus 1.

In the example illustrated in FIG. 1, the projection optical unit 7 includes eight mirrors $M_1$ to $M_8$. Alternatives with four, six, ten, twelve or any other number of mirrors $M_i$ are also possible.

In particular, the projection optical unit 7 has an anamorphic embodiment. In particular, it has different imaging scales $\beta_x$, $\beta_y$ in the x-direction and y-direction. The two imaging scales $\beta_x$, $\beta_y$ of the projection optical unit 7 are optionally $(\beta_x, \beta_y)=(+0.25, -0.125)$. Consequently, in the x-direction, i.e., in the direction perpendicular to the scanning direction, the projection optical unit 7 leads to a reduction with a ratio of 4:1.

In the y-direction, i.e., in a scanning direction, the projection optical unit 7 leads to a reduction of 8:1.

Other imaging scales are likewise possible. Imaging scales with the same sign in the x-direction and y-direction are also possible.

FIG. 2 once again illustrates the beam path of the illumination radiation 10 in the illumination system 2 in simplified fashion. The assignment of two pupil facets 14a to two field facets 13a for forming two illumination channels for illuminating the object field 5 is illustrated in exemplary fashion. A Köhler-type illumination is illustrated. With the aid of the field facets 13a, the far field is decomposed into a multiplicity of object fields 5. The field facets 13a generate a multiplicity of images of the intermediate focus on the pupil facets 14a respectively assigned thereto.

Figure 3:
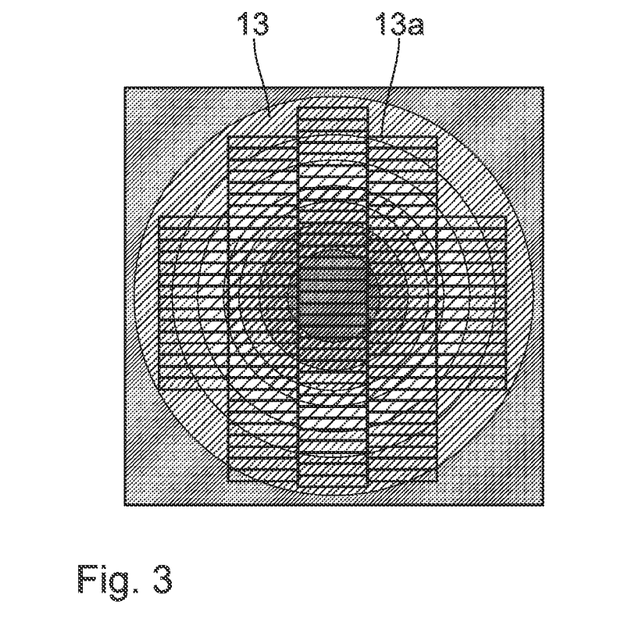
FIG. 3 shows the intensity distribution on the first facet mirror of the illumination optical unit as per FIG. 2 in exemplary fashion.

The illumination of the field facet mirror 13 is illustrated in exemplary fashion in FIG. 3.

Figure 4:
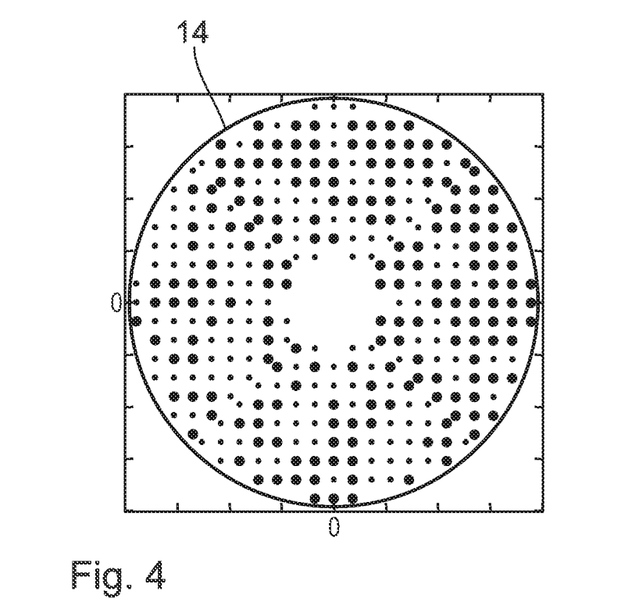
FIG. 4 shows the intensity distribution on the second facet mirror of the illumination optical unit as per FIG. 2 in schematic fashion.

The illumination of the pupil facet mirror 14 is illustrated in exemplary fashion in FIG. 4. Illustrated here, in particular, are the images of the intermediate focus 16 on the pupil facet mirror 14.

The field facets 13a are each imaged onto the reticle 20 by an associated pupil facet 14a for illuminating the object field 5.

Figure 5:
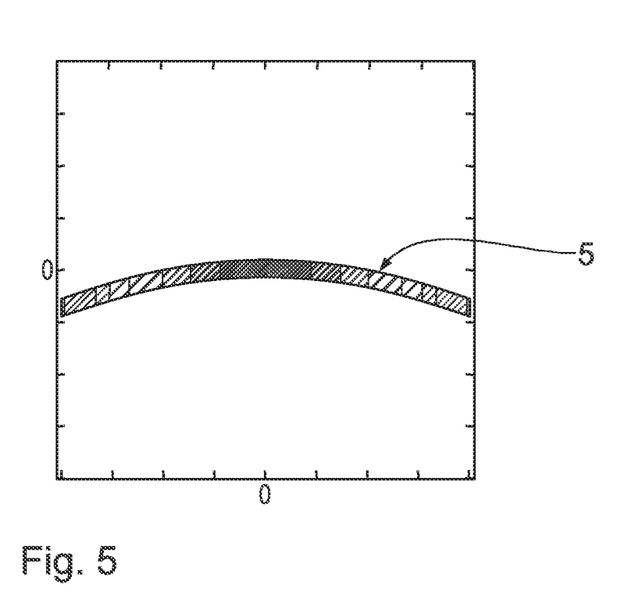
FIG. 5 schematically shows the intensity distribution in the object field of the illumination optical unit as per FIG. 2.

An exemplary illumination of the object field 5 is illustrated in FIG. 5. In particular, the illumination of the object field 5 is as homogeneous as possible. Optionally, it has a uniformity error of less than 2%.

The field uniformity can be achieved by a superposition of different illumination channels.

The pupil uniformity can be achieved by a redistribution of the illumination channels.

The illumination of the entrance pupil of the projection optical unit 7 can be defined geometrically by way of an arrangement of the pupil facets. It is possible to set the intensity distribution in the entrance pupil of the projection optical unit 7 by selecting the illumination channels, in particular the subset of the pupil facets guiding light.

Further aspects and details of the illumination of the object field 5 and, in particular, the entrance pupil of the projection optical unit 7 are described below.

The projection optical unit 7 has a homocentric entrance pupil, in particular. It may be accessible. It may also be inaccessible.

It was recognized that it is often not possible to exactly illuminate the entrance pupil of the projection optical unit 7 using the pupil facet mirror 14. In particular, it was recognized that the aperture rays often do not intersect at a single point in the case of imaging of the projection optical unit 7 which images the center of the pupil facet mirror 14 on the wafer 22 in telecentric fashion. However, it is possible to find a surface in which the spacing of the aperture rays determined in pairwise fashion becomes minimal. This surface represents the entrance pupil or a surface conjugate thereto in real space. According to the disclosure, it was recognized that the pupil facets 14a are desirably disposed on this surface where possible in order to generate, on the image side at the wafer 22, an illumination of the exit pupil of the projection optical unit 7 that is as field-independent as possible. In particular, this surface exhibits a finite curvature.

It may even be the case that the projection optical unit 7 has different relative positions of the entrance pupil for the tangential beam path and for the sagittal beam path. In this case, an imaging element, in particular an optical component of the transmission optical unit 15, should be provided between the second facet mirror 14 and the reticle 20. With the aid of this optical element, it is possible to take account of the different relative positions of the tangential entrance pupil and the sagittal entrance pupil.

In the arrangement of the components of the illumination optical unit 4 illustrated in FIG. 1, the pupil facet mirror 14 is not disposed on a surface conjugate to the entrance pupil of the projection optical unit 7. Moreover, it is tilted with respect to the object plane 5. Moreover, it is disposed in tilted fashion in relation to a plane defined by the field facet mirror 13. According to the disclosure, it was identified that a strong tilt of the pupil facet mirror 14 relative to the field facet mirror 13 leads to the field facets 13a in part generating very defocused images of the intermediate focus 16 when switching between different illumination settings. This leads either to an increase in the degree of pupil filling and hence in the maximum achievable resolution limit or to the loss of illumination radiation and hence a reduced transmission and a simultaneous reduction in the system stability.

However, an alignment of the pupil facet mirror 14 parallel to the field facet mirror 13 leads to a field-dependent illumination of the exit pupil of the projection optical unit 7 at the wafer 22.

It has emerged that an alignment of the pupil facet mirror 14 that leads to a folding angle ranging from 20° to 35° represents a particularly good compromise between these two alternatives. Here, the folding angle denotes twice the mean angle of incidence of the central illumination rays on the pupil facets 14a.

Further, it was found that an advantageous arrangement of the pupil facet mirror 14 is also described by the angle $\varphi_{EPK\text{-}MM2}$ through which the pupil facet mirror 14 in relation to the plane that represents the conjugate entrance pupil surface (EPK) to the best possible extent.

The smallest source images on the pupil facet mirror 14 arise in the case of an arrangement of same perpendicular to the connecting line between the field facet mirror 13 and the pupil facet mirror 14. In this case, the following applies:

$$\varphi_{EPK\text{-}MM2} = \varphi_{EPK} + \varphi_{MM2}$$

Figure 6:
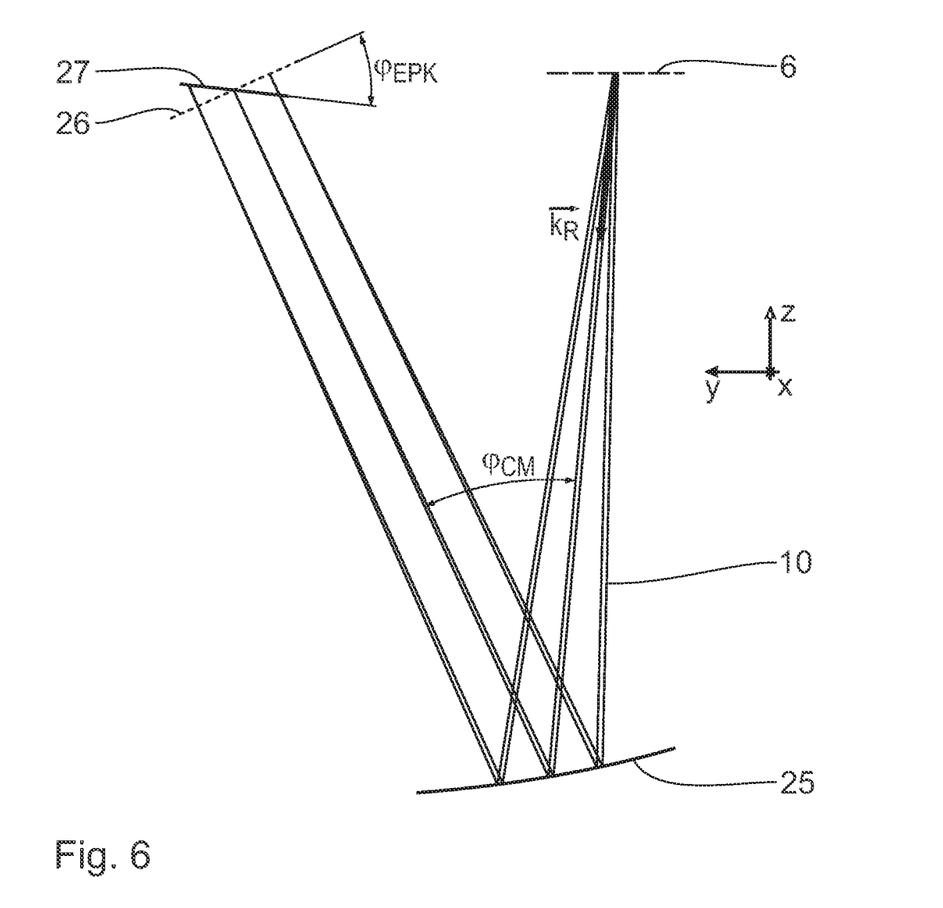
FIG. 6 shows a schematic illustration for explaining the tilt of a plane (EPK) that is conjugate to an entrance pupil plane of the projection optical unit to the best-possible extent relative to a plane orthogonal to the reference chief ray.

Here, φEPK denotes the angle of the plane 26, perpendicular to the reference chief ray $\vec{k}_r$ following the reflection at the condenser mirror 25, with respect to the plane EPK 27 (see FIG. 6). The reference chief ray belongs to the centroid of the rectangle circumscribing the wafer-side image field. Here, the exit pupil is telecentric or virtually telecentric. In particular, the condenser mirror 25 is an optical constituent part of the transmission optical unit 15.

In order to reduce the geometric pupil errors, it may be expedient to place the pupil facet mirror 14 onto the angle bisector of the angle between the condenser mirror, the pupil facet mirror 14 and the field facet mirror 13. In this case, the following applies:

$$\varphi_{EPK\text{-}MM2} = \varphi_{EPK} + \tfrac{1}{2}\varphi_{MM2}$$

Advantageously, the angle $\varphi_{EPK\text{-}MM2}$ is between the two specified values:

$$\varphi_{EPK} + \tfrac{1}{2}\varphi_{MM2} \leq \varphi_{EPK\text{-}MM2} \leq \varphi_{EPK} + \varphi_{MM2}$$

A further boundary condition of the projection optical unit 7, in particular for a free-form surface design, is a strictly homocentric relative position of the entrance pupil. However, there may be two homocentric centers which are spaced apart from one another and may even differ in sign;

i.e., one of the homocentric centers is situated upstream of the reticle 20 in the radiation direction and the other therebehind.

According to the disclosure, it was recognized that it is possible to serve both homocentric centers with one optical system between the pupil facet mirror 14 and the reticle 20, in particular with the aid of the transmission optical unit 15. In particular, this can be achieved by a toric embodiment of the condenser mirror 25. This has as a consequence that an aspect ratio of the two principal axes a and b of the smallest elliptical edge curve (footprint), which envelops all pupil facets 14a, does not necessarily correspond to the ratio of the two imaging scales of the projection optical unit 7 imaging in anamorphic fashion.

If the two homocentric centers $EP_x$, $EP_y$ are spaced apart from one another, the axis ratio a/b is calculated in paraxial fashion as $$\frac{a}{b} = \frac{\beta_x EP_x EP_y + d_{CM}}{\beta_y EP_y EP_x + d_{CM}}$$

where $d_{CM}$ denotes the distance from reticle 20, for example from the geometric centroid of the rectangle enveloping the object field 5, to the condenser mirror 25.

A large distance $d_{CM}$ between the reticle 20 and the condenser mirror 25 was found to be particularly expedient for the system transmission. In particular, 2000 mm<$d_{CM}$<3000 mm applies.

Moreover, a large difference between the two homocentric centers was found to be particularly advantageous in the design of the projection optical unit 7. The following applies to a particularly advantageous optical system: 2000 mm<$EP_x$<3000 mm and 5000 mm<$EP_y$<8000 mm. These distances are measured from the centroid of the rectangle circumscribing the reticle-side image field. A "positive distance" means that the homocentric centers are disposed downstream of the reticle in the light direction.

The following applies to an axis ratio a/b: 1.10<a/b<1.68, in particular 1.24<a/b<1.52.

Figure 9:
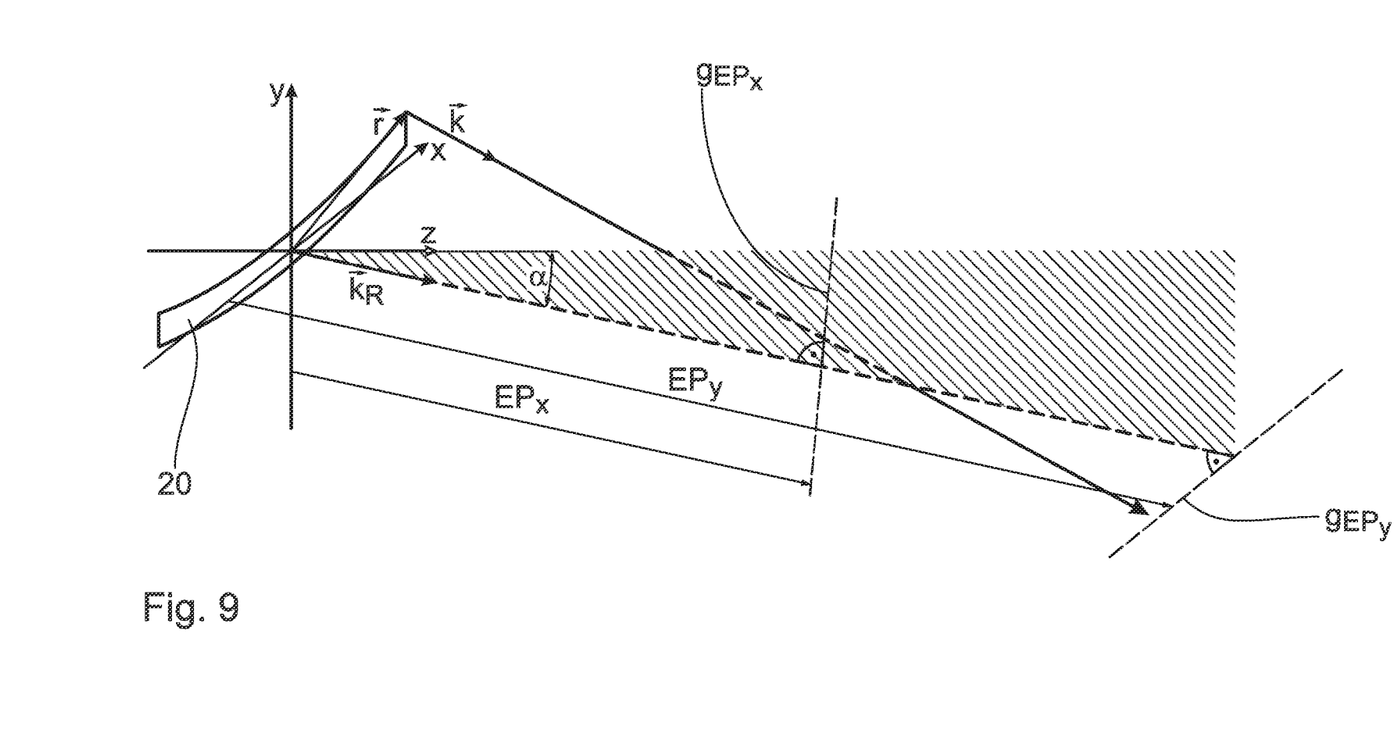
FIG. 9 shows a schematic sketch for elucidating the bihomocentric relative position of the entrance pupil.

FIG. 9 illustrates the geometric relationships, in particular the relative position of the homocentric centers and the homocentric straight line, in the case of a bihomocentric entrance pupil, in exemplary fashion. In the illustrated case, both homocentric centers ($EP_x$, $EP_y$) are disposed downstream of the reticle 20 in the radiation direction. Consequently, they are inaccessible for the illumination. In FIG. 9, apart from a field point $\vec{r}$=(x,y,0) at the reticle 20, the reference chief ray direction $$\vec{k_R} = (0, -\sin(\alpha), \cos(\alpha))$$

the sagittal telecentric straight line $\vec{g_{EPx}} = EP_x \vec{k_R} + \upsilon(0, \cos(\alpha), \sin(\alpha))$ and the tangential telecentric straight line $\vec{g_{EPy}} = EP_y \vec{k_R} + \nu (1,0,0)$ are illustrated in exemplary fashion. As elucidated in FIG. 9, the relative sagittal pupil position and the relative tangential pupil position need not coincide, i.e., they may be spaced apart from one another.

Illuminating the reticle 20 in convergent fashion may be advantageous for the design of the projection optical unit 7. This yields an inaccessible relative position of the entrance pupil of the projection optical unit 7. In this case, the illumination system 2 has at least one optical element with refractive power, for example a corresponding condenser mirror 25, between the pupil facet mirror 14 and the reticle 20. With the aid of this optical element, it is possible to image the pupil facet mirror 14 into the entrance pupil.

As already mentioned, there may be a deviation between the tangential refractive power and the sagittal refractive power of this optical element. As a result of this, firstly, it is possible to compensate an astigmatism resulting from a folding angle at the condenser mirror 25; secondly, this can assist the astigmatic imaging of the entrance pupil.

The relative difference between the refractive powers $$\delta R_{rel} = 100\% \frac{|R_{tan} - R_{sag}|}{\frac{1}{2}(R_{tan} + R_{sag})}$$

can range from 5% to 30%, in particular ranges from 7% to 22%.

A corresponding refractive power or radius difference can be achieved by a single condenser mirror or by a transmission optical unit 15 with a plurality of mirrors. In particular, the transmission optical unit 15 may include one or two normal incidence mirrors (NI mirrors) and/or one or two grazing incidence mirrors (GI mirrors).

The distance $d_{MM2-CM}$ between the pupil facet mirror 14 and the condenser mirror 25 can range from 1500 mm to 2500 mm.

Moreover, it was recognized that such an embodiment of the illumination optical unit 4, in particular of the transmission optical unit 15, leads to the footprint of the illumination radiation 10 on the pupil facet mirror 14 deviating from an elliptic form. Here, the footprint denotes the intersection of the surface of the pupil facet mirror 14 with the light tube defined by the numerical aperture on the wafer 22. All of the pupil facets 14a are disposed within this footprint. The actual optical footprint on the pupil facet mirror 14 is usually jagged, i.e., fragmented.

Figure 7:
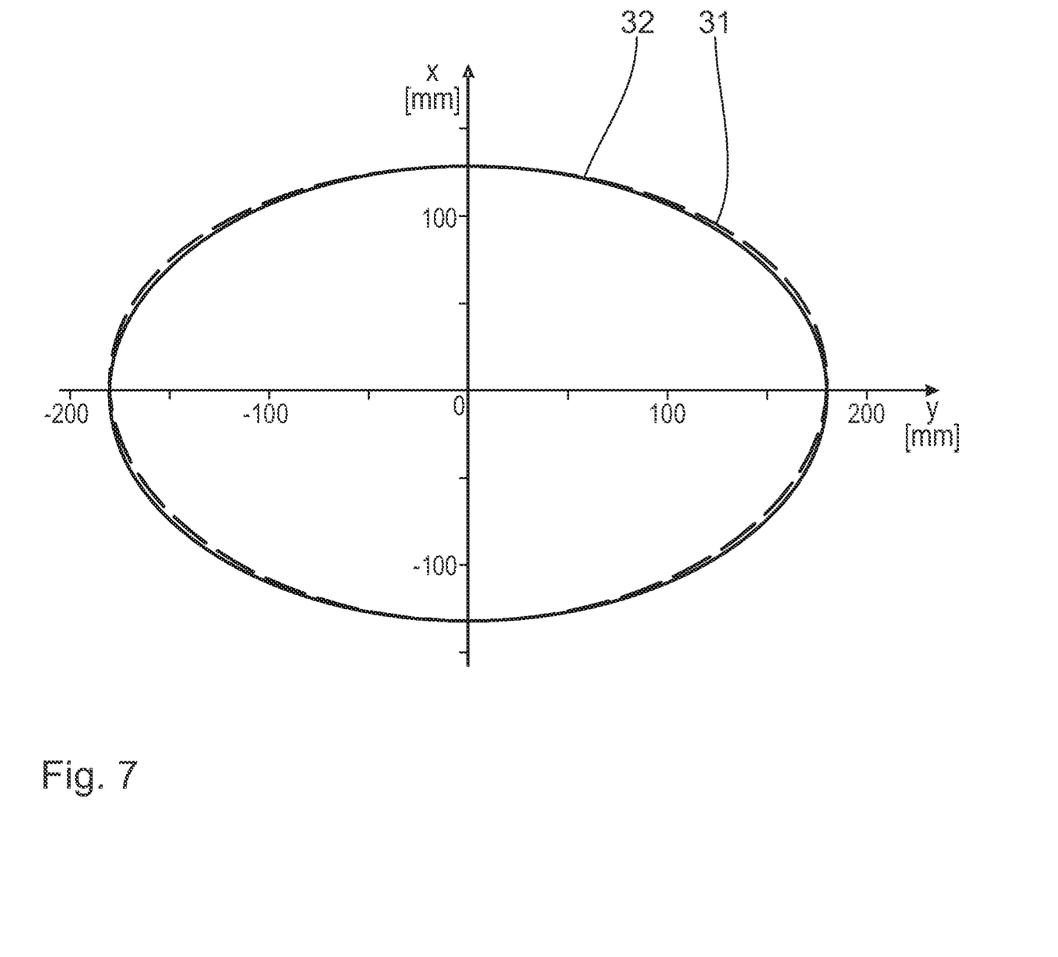
FIG. 7 schematically shows the comparison of a real footprint on the second facet mirror with an ellipse.

The deviation of the footprint 31 from an ellipse 32 is illustrated in exemplary fashion in FIG. 7. The ellipse 32 is the ellipse that approximates the footprint 31 to the best-possible extent. Here, the best possible means within the sense of the least-squares method (least-squares fit), for example.

If the approximated ellipse is parameterized in local coordinates as follows:

$$\vec{r}(\varphi) = (\alpha \cos(\varphi), b \cos(\varphi) + b_0)$$

then the real footprint 31 ($r_{real}$) can be generated by stretching $t(\varphi)$ from this ellipse:

$$\vec{r_{real}}(\varphi) = t(\varphi) \vec{r}(\varphi) = (1 + \alpha(\varphi)) \vec{r}(\varphi),$$

where the following applies:

$$\alpha(\varphi) = -A \sin(3\varphi)$$

with 0.005<A<0.02.

According to a further aspect of the disclosure, the pupil facets 14a have different refractive powers in the tangential and sagittal direction. As a result of this, it is possible to at least approximately image the field facets 13a onto the reticle 20.

The pupil facets 14a, in particular at least a subset of same, can have principal radii of curvature in the sagittal and tangential sections, the relative difference of which is at least 20%, in particular at least 50%, in particular at least 100%. It is also possible for all pupil facets 14a to have different refractive powers in the tangential and sagittal directions.

Figure 8:
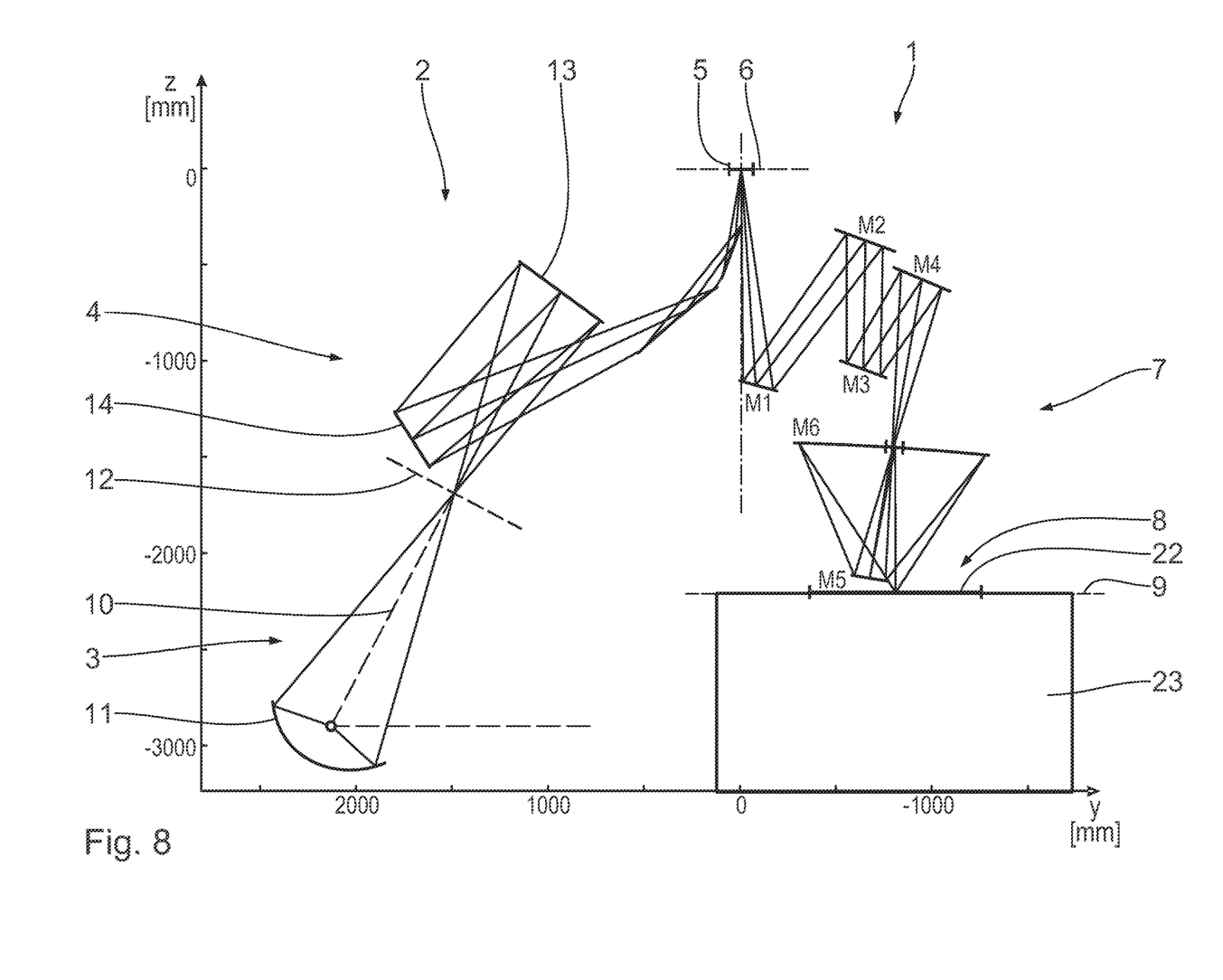
FIG. 8 schematically shows an illustration as per FIG. 1 according to one alternative.

FIG. 8 schematically illustrates the beam path in a projection exposure apparatus 1 with an alternative design, in particular an alternative arrangement of the first facet mirror 13 and of the second facet mirror 14. According to this alternative, the transmission optical unit 15 includes two GI mirrors.

What is claimed is:

1. An optical system, comprising:
    an illumination optical unit configured to guide illumination radiation along a path to an object plane, the illumination optical unit comprising:
        a first facet mirror;
        a second facet mirror disposed downstream of the first facet mirror along the path; and
        a condenser mirror; and
    a projection optical unit configured to image a first object in the object plane onto a second object in an image plane,
    wherein:
        the image plane is a first distance from the object plane;
        the condenser mirror is a second distance from the object plane;
        the second distance is greater than the first distance; and
        the projection optical unit is configured to image in an anamorphic fashion.

2. The optical system of claim 1, wherein the condenser mirror is in the path between the second facet mirror and the object plane.

3. The optical system of claim 1, wherein the condenser mirror comprises a toric mirror.

4. The optical system of claim 1, wherein the second distance is from 2000 mm to 3000 mm.

5. The optical system of claim 4, wherein the second facet mirror is a third distance from the condenser mirror, and the third distance is from 1500 mm to 2500 mm.

6. The optical system of claim 1, wherein:
    the second facet mirror comprises a pupil facet mirror;
    the pupil facet mirror comprises a plurality of pupil facets;
    a totality of the pupil facets has a smallest elliptical edge curve enveloping the pupil facets;
    the smallest elliptical edge curve has a first axis and a second axis perpendicular to the first axis; and
    a ratio of the first second axes is from 1.1 to 1.68.

7. The optical system of claim 6, wherein, for at least a subset of the pupil facets, the pupil facets comprise different refractive powers in a tangential direction and a sagittal direction.

8. The optical system of claim 1, wherein:
    a footprint on the second facet mirror has an envelope with a first aspect ratio;
    the projection optical unit has an entrance pupil with a second aspect ratio; and
    the first aspect ratio is not the same as the second aspect ratio.

9. The optical system of claim 1, wherein a footprint on the second facet mirror has a non-elliptical shape.

10. The optical system of claim 1, wherein the projection optical unit has a mechanically inaccessible entrance pupil.

11. The optical system of claim 1, wherein the second facet mirror is tiltable through an angle $\varphi_{EPK-MM2}$ relative to a plane that is conjugate to an entrance pupil plane of the projection optical unit to a best-possible extent that is tilted through an angle $\varphi_{EPK}$ with respect to a plane extending perpendicular to a chief ray, where $\varphi_{EPK} + \frac{1}{2}\varphi_{MM2} < \varphi_{PEPK-MM2} < \varphi_{EPK} + \varphi_{MM2}$.

12. The optical system of claim 11, wherein the second facet mirror is tilted relative to the first facet mirror so that an average folding angle $\varphi_{MM2}$ is from 20° to 35°.

13. The optical system of claim 1, further comprising a transmission optical unit downstream of the second facet mirror in the beam path, wherein the transmission optical unit has different refractive powers in a tangential direction and a sagittal direction.

14. The optical system of claim 13, wherein a relative refractive power difference of the transmission optical unit is given by 100%

$$\frac{|R_{tan} - R_{sag}|}{\frac{1}{2}(R_{tan} + R_{sag})},$$

and the relative refractive power difference is from 5% to 30%.

15. The optical system of claim 13, wherein the transmission optical unit comprises a mirror.

16. The optical system of claim 13, wherein the transmission optical unit comprises a normal incidence mirror and a grazing incidence mirror.

17. An apparatus, comprising:
    an optical system according to claim 1, wherein
    the apparatus is a microlithographic projection exposure apparatus.

18. The optical system of claim 1, wherein at least a portion of the illumination radiation enters the illumination optical unit with a vector directed away from object plane.

19. An optical system, comprising:
    an illumination optical unit configured to guide illumination radiation along a path to an object plane, the illumination optical unit comprising:
        a first facet mirror;
        a second facet mirror disposed downstream of the first facet mirror along the path; and
        a condenser mirror; and
    a projection optical unit configured to image a first object in the object plane onto a second object in an image plane,
    wherein:
        the image plane is a first distance from the object plane;
        the condenser mirror a second distance from the object plane;
        the second distance is greater than the first distance; and
        the second distance is from 2000 mm to 3000 mm.

20. The optical system of claim 19, wherein at least a portion of the illumination radiation enters the illumination optical unit with a vector directed away from object plane.

21. An optical system, comprising:
    an illumination optical unit configured to guide illumination radiation along a path to an object plane, the illumination optical unit comprising:
        a first facet mirror;
        a second facet mirror disposed downstream of the first facet mirror along the path; and
        a condenser mirror; and
    a projection optical unit configured to image a first object in the object plane onto a second object in an image plane, wherein:
  the image plane is a first distance from the object plane;
  the condenser mirror a second distance from the object plane;
  the second distance is greater than the first distance; and at least a portion of the illumination radiation enters the illumination optical unit with a vector directed away from object plane.

\* \* \* \* \*

UNITED STATES PATENT AND TRADEMARK OFFICE
CERTIFICATE OF CORRECTION

PATENT NO. : 11,169,445 B2
APPLICATION NO. : 15/930406
DATED : November 9, 2021
INVENTOR(S) : Bieling et al.

Page 1 of 1

It is certified that error appears in the above-identified patent and that said Letters Patent is hereby corrected as shown below:

On the Title Page

Column 2 item (56) (U.S. Patent Documents), Line 2, delete "Biding" and insert -- Bieling --;

Page 2, Column 1 item (57) (Abstract), Line 6, after "mirror" insert -- is --;

Page 2, Column 1 item (57) (Abstract), Line 7, delete "first distance" and insert -- first distance. --;

In the Specification

Column 3, Line 8, delete "$\alpha(\varphi)$" and insert -- $\alpha(\varphi))$ --;

Column 5, Line 51, delete "synchrotronbased" and insert -- synchrotron-based --;

Column 8, Line 43, delete "φEPK" and insert -- $\varphi_{EPK}$ --;

In the Claims

Column 11, Line 45, Claim 6, delete "first second" and insert -- first and second --;

Column 11, Line 67, Claim 11, delete "<φPEPK" and insert -- <$\varphi_{EPK}$ --;

Column 12, Line 48, Claim 19, after "mirror" insert -- is --;

Column 13, Line 3, Claim 21, after "mirror" insert -- is --.

Signed and Sealed this
Eighth Day of February, 2022

Drew Hirshfeld
*Performing the Functions and Duties of the
Under Secretary of Commerce for Intellectual Property and
Director of the United States Patent and Trademark Office*